United States Patent
Basker et al.

(10) Patent No.: US 9,406,682 B2
(45) Date of Patent: Aug. 2, 2016

(54) METHOD AND STRUCTURE FOR PREVENTING EPI MERGING IN EMBEDDED DYNAMIC RANDOM ACCESS MEMORY

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 64 days.

(21) Appl. No.: 14/484,495

(22) Filed: Sep. 12, 2014

(65) Prior Publication Data

US 2016/0079248 A1     Mar. 17, 2016

(51) Int. Cl.
| | |
|---|---|
| *H01L 27/108* | (2006.01) |
| *H01L 29/161* | (2006.01) |
| *H01L 29/66* | (2006.01) |
| *H01L 21/3105* | (2006.01) |
| *H01L 21/84* | (2006.01) |
| *H01L 27/12* | (2006.01) |

(52) U.S. Cl.
CPC .... *H01L 27/10826* (2013.01); *H01L 21/31051* (2013.01); *H01L 21/845* (2013.01); *H01L 27/10879* (2013.01); *H01L 27/10894* (2013.01); *H01L 27/10897* (2013.01); *H01L 27/1211* (2013.01); *H01L 29/161* (2013.01); *H01L 29/6653* (2013.01); *H01L 29/6656* (2013.01)

(58) Field of Classification Search
CPC ............... H01L 27/10894; H01L 27/10897; H01L 29/6653
See application file for complete search history.

(56) References Cited

U.S. PATENT DOCUMENTS

| | | | |
|---|---|---|---|
| 8,420,459 | B1 | 4/2013 | Cheng et al. |
| 8,421,139 | B2 | 4/2013 | Kanakasabapathy et al. |
| 8,482,073 | B2 | 7/2013 | Chen et al. |
| 8,488,359 | B2 | 7/2013 | Chung |

(Continued)

OTHER PUBLICATIONS

Lu, D., "A comparative study of fin-last and fin-first SOI FinFETs" 2013 International Conference on Simulation of Semiconductor Processes and Devices (SISPAD) (Sep. 3-5, 2013) pp. 147-150.

*Primary Examiner* — Caleb Henry
*Assistant Examiner* — Mounir Amer
(74) *Attorney, Agent, or Firm* — Scully, Scott, Murphy & Presser, P.C.; Steven J. Meyers

(57) ABSTRACT

After forming a plurality of first semiconductor fins having a first spacing in a logic device region and a plurality of second semiconductor fins having a second spacing in a memory device region, sacrificial spacers are formed on sidewalls of the plurality of the first semiconductor fins and the plurality of the second semiconductor fins to completely fill spaces between the plurality of first semiconductor fins, but only partially fill spaces between second semiconductor fins. Next, dielectric barrier layer portions are formed in gaps between the sacrificial spacers. After removal of the sacrificial spacers, an entirety of the plurality of first semiconductor fins is laterally enclosed by a corresponding pair of neighboring dielectric barrier layers, while each of the plurality of second semiconductor fins is laterally enclosed by a corresponding pair of neighboring dielectric barrier layer portions.

15 Claims, 11 Drawing Sheets

(56) References Cited

U.S. PATENT DOCUMENTS

| | | |
|---|---|---|
| 8,582,359 B2 | 11/2013 | Widjaja |
| 8,603,893 B1 | 12/2013 | Wei et al. |
| 8,604,539 B2 | 12/2013 | Cheng et al. |
| 8,623,712 B2 | 1/2014 | Cheng et al. |
| 2004/0253775 A1 | 12/2004 | Achuthan et al. |
| 2011/0248326 A1 | 10/2011 | Kanakasabapathy et al. |
| 2012/0261726 A1* | 10/2012 | Yang ................ H01L 21/28123 257/288 |
| 2013/0005129 A1 | 1/2013 | Kanakasabapathy et al. |
| 2013/0277760 A1 | 10/2013 | Lu et al. |
| 2014/0045312 A1 | 2/2014 | Cheng et al. |
| 2015/0069526 A1* | 3/2015 | Basker ................ H01L 29/7856 257/401 |
| 2015/0137181 A1* | 5/2015 | Basker ................ H01L 27/0924 257/192 |
| 2015/0279829 A1* | 10/2015 | Kuo ........................ H01L 25/50 438/108 |

\* cited by examiner

METHOD AND STRUCTURE FOR PREVENTING EPI MERGING IN EMBEDDED DYNAMIC RANDOM ACCESS MEMORY

BACKGROUND

The present application relates to integrated circuits and, more particularly to a method and a structure that enable sufficient source/drain epitaxy growth to merge adjacent semiconductor fins in logic devices, while preventing epitaxy merging of adjacent semiconductor fins in embedded dynamic random access memory (eDRAM) devices.

As integrated circuits continue to scale downward in size, fin field effect transistors (FinFETs) are becoming increasingly attractive to be used in smaller nodes, e.g., the 22 nm node and beyond. Embedded dynamic random access memory (eDRAM) devices have been found to be a viable approach to boost chip performance. Integrated FinFET logic devices and eDRAM devices are becoming increasingly important for future scaled integrated circuits.

The current fabrication processes in the integration of logic and eDRAM FinFETs are complex because requirements for achieving high-performance logic devices are different from those for memory devices. For example, in these advanced circuits, the logic FinFETs require sufficient source/drain epitaxy growth to merge adjacent semiconductor fins so as to lower the source/drain resistance. However, such epitaxy growth process can cause undesired merging of adjacent semiconductor fins in eDRAM FinFETs. This may be problematic in that it can cause electrical shorts in eDRAM FinFETs. One way to circumvent the short problem in the eDRAM FinFETs is to reduce the extent of the source/drain epitaxy growth; however the insufficient source/drain epitaxy growth may cause high source/drain resistance and thus compromise the logic FinFET performance, particularly for those high performance logic FinFETs. As such, there remains a need to develop a method and a structure that would allow merging semiconductor fins in the logic devices, but not semiconductor fins in the memory devices, without adding additional steps and/or cost to manufacture.

SUMMARY

The present application provides a method and a structure that enable sufficient source/drain epitaxy growth to merge adjacent semiconductor fins in logic devices, while preventing epitaxy merging of adjacent semiconductor fins in eDRAM devices when integrating an array of memory devices and an array of logic devices on a single substrate. After forming a plurality of first semiconductor fins having a first spacing in a logic device region and a plurality of second semiconductor fins having a second spacing in a memory device region, sacrificial spacers are formed on sidewalls of the plurality of the first semiconductor fins and the plurality of the second semiconductor fins to completely fill spaces between the plurality of first semiconductor fins, but only partially fill spaces between second semiconductor fins. Dielectric barrier layer portions are then formed in gaps between the sacrificial spacers. After removal of the sacrificial spacers, an entirety of the plurality of first semiconductor fins is laterally enclosed by a corresponding pair of neighboring dielectric barrier layers, while each of the plurality of second semiconductor fins is laterally enclosed by a corresponding pair of neighboring dielectric barrier layer portions.

In one aspect of the present application, a method of forming a semiconductor structure is provided. The method includes first forming a plurality of first semiconductor fins in a first device region of a substrate and a plurality of second semiconductor fins in a second device region of the substrate. The plurality of first semiconductor fins are separated from each other by a first spacing and the plurality of second semiconductor fins are separated from each other by a second spacing that is greater than the first spacing. Next, sacrificial spacers are formed on sidewalls of the plurality of first semiconductor fins and the plurality of second semiconductor fins. The sacrificial spacers fill spaces between the plurality of first semiconductor fins, but only partially fill spaces between the plurality of second semiconductor fins and between an outermost first semiconductor fin of the plurality of first semiconductor fins and an adjacent outermost second semiconductor fin of the plurality of second semiconductor fins, leaving gaps between the plurality of second semiconductor fins and between the outermost first semiconductor fin and the adjacent outermost second semiconductor fin. Dielectric barrier layer portions are then formed on the substrate. The dielectric barrier layer fills the gaps between the sacrificial spacers. After removing the sacrificial spacers selective to the dielectric barrier layer portions, a gate structure is formed over a channel portion of each of the plurality of first semiconductor fins and the plurality of second semiconductor fins. Next, source/drain regions are formed on portions of the plurality of first semiconductor fins and the plurality of second semiconductor fins that are not covered by the gate structure, wherein the source/drain regions merge the plurality of first semiconductor fins but not the plurality of second semiconductor fins.

In another aspect of the present application, a semiconductor structure is provided. The semiconductor structure includes a plurality of first semiconductor fins having a first spacing and a plurality of second semiconductor fins having a second spacing located on a substrate. The plurality of first semiconductor fins is spaced apart from the plurality of the second semiconductor fins. The semiconductor structure further includes dielectric barrier layer portions located on the substrate, in which an entirety of the plurality of first semiconductor fins are laterally enclosed by a corresponding pair of neighboring dielectric barrier layer portions and each of the plurality of the second semiconductor fins is laterally enclosed by a corresponding pair of neighboring dielectric barrier layer portions. The semiconductor structure further includes a gate structure present on a channel portion of each of the plurality of first semiconductor fins and the plurality of second semiconductor fins, a first epitaxial semiconductor material portion present between adjacent first semiconductor fins in the plurality of first semiconductor fins to merge the plurality of first semiconductor fins, and a second epitaxial semiconductor material portion present at least on sidewalls of each of the plurality of second semiconductor fins. The first epitaxial semiconductor material portion is in contact with vertical sidewalls of the corresponding pair of neighbor dielectric barrier layer portions that laterally enclose the entirety of the plurality of first semiconductor fins. The second epitaxial semiconductor material portion is in contact with vertical sidewalls of the corresponding pair of neighbor dielectric barrier layer portions that laterally enclose the each of the plurality of second semiconductor fins.

DETAILED DESCRIPTION

Figure 1:
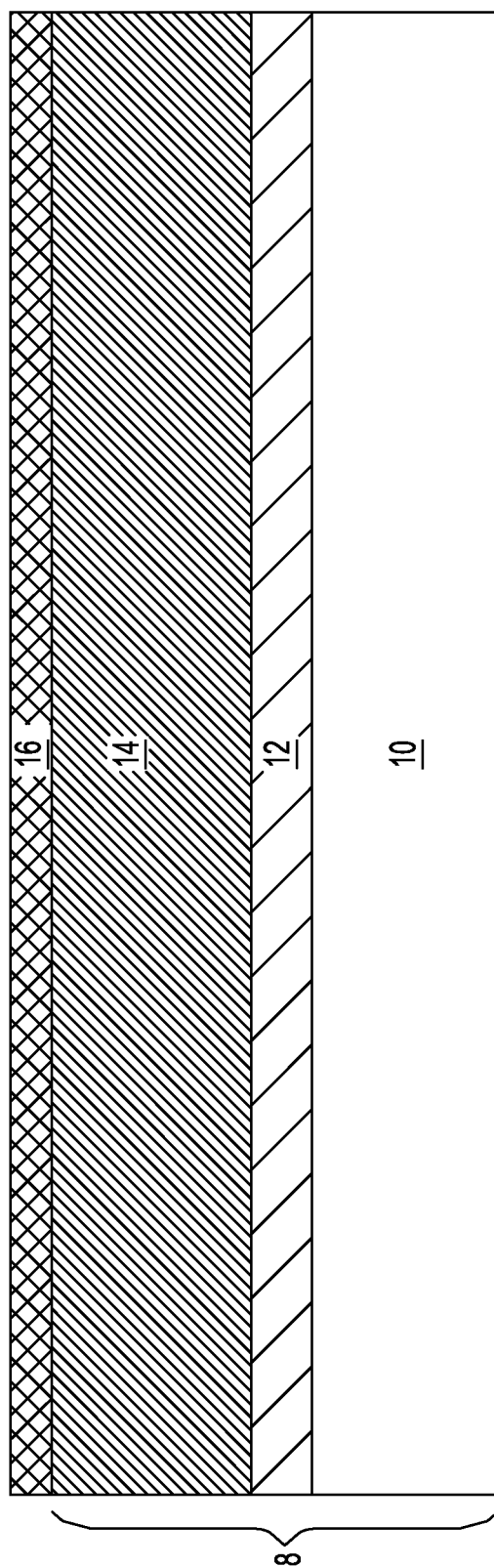
FIG. 1 is a cross-sectional view of an exemplary semiconductor structure including a semiconductor substrate and a dielectric cap layer in accordance with an embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure that can be employed according to an embodiment of the present application is provided. The exemplary semiconductor structure includes a semiconductor substrate 8 and a dielectric cap layer 16 formed on the semiconductor substrate 8. In one embodiment (not shown), the semiconductor substrate 8 can be a bulk substrate including a bulk semiconductor material throughout. In another embodiment and as shown in FIG. 1, the semiconductor substrate 8 is a semiconductor-on-insulator (SOI) substrate including a handle substrate 10, a buried insulator layer 12 and a top semiconductor layer 14.

The handle substrate 10 can include a first semiconductor material, such as, for example, Si, Ge, SiGe, SiC, SiGeC, and III/V compound semiconductors. The handle substrate 10 provides mechanical support to the buried insulator layer 12 and the top semiconductor layer 14. The thickness of the handle substrate 10 can be from 30 µm to about 2 mm, although less and greater thicknesses can also be employed.

The buried insulator layer 12 includes a dielectric material such as silicon oxide, silicon nitride, silicon oxynitride, or a combination thereof. The thickness of the buried insulator layer 12 can be from 50 nm to 200 nm, with a thickness from 100 nm to 150 nm being more typical.

The top semiconductor layer 14 can include a second semiconductor material such as, for example, Si, Ge, SiGe, SiC, SiGeC, and III/V compound semiconductors such as, for example, InAs, GaAs, and InP. The semiconductor materials of the top semiconductor layer 14 and the handle substrate 10 may be the same or different. Typically, each of the handle substrate 10 and the top semiconductor layer 14 comprises a single crystalline semiconductor material, such as, for example, single crystalline silicon. The top semiconductor layer 14 may or may not be doped with p-type dopants and/or n-type dopants. Examples of p-type dopants include, but are not limited to, boron, aluminum, gallium and indium. Examples of n-type dopants include, but are not limited to, antimony, arsenic and phosphorous. The thickness of the top semiconductor layer 14 can be from 10 nm to 200 nm, with a thickness from 30 nm to 70 nm being more typical.

The dielectric cap layer 16 that is formed on the top semiconductor layer 14 (or topmost semiconductor surface of a bulk substrate) can include a dielectric material such as, for example, silicon oxide, silicon nitride, silicon oxynitride, a dielectric metal oxide, or a combination thereof. The dielectric cap layer 16 can be formed by conventional deposition processes, such as, for example chemical vapor deposition (CVD) or plasma-enhanced CVD (PECVD). Alternatively, a thermal growing process such as thermal oxidation may be used in forming the dielectric cap layer 16. The thickness of the dielectric cap layer 16 can be from 5 nm to 20 nm, although lesser and greater thicknesses can also be employed. During the subsequent formation of the semiconductor fins, a portion of the dielectric cap layer 16 provides a dielectric cap atop each semiconductor fin.

Figure 2:
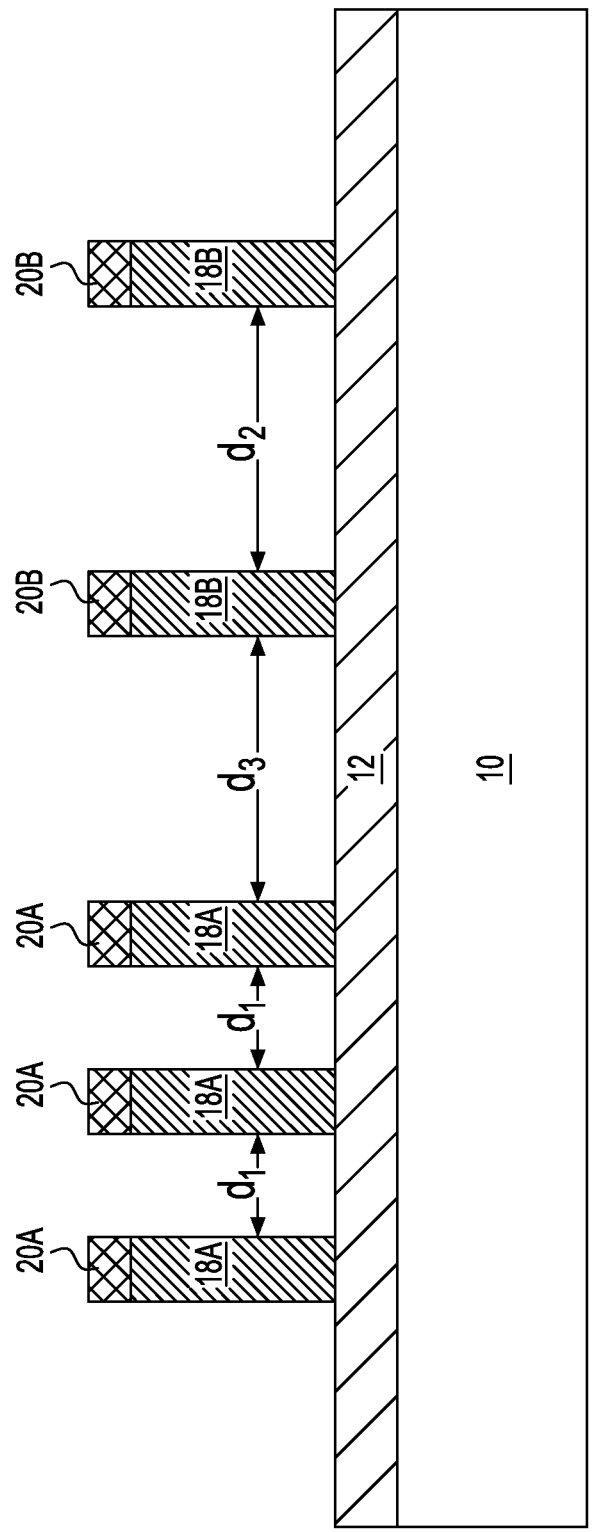
FIG. 2 is a cross-sectional view of the exemplary semiconductor structure after forming a plurality of first semiconductor fins in a logic device region of the semiconductor substrate and a plurality of second semiconductor fins in a memory device region of the semiconductor substrate.

Referring to FIG. 2, a plurality of first semiconductor fins 18A having a first dielectric cap 20A atop each of the first semiconductor fins 18A is formed in a logic device region and a plurality of second semiconductor fins 18B having a second dielectric cap 20B atop each of the second semiconductor fins 18B is formed in a memory device region.

The semiconductor fins 18A, 18B can be formed by lithography and etching. Lithography can include forming a photoresist (not shown) on a top surface of the dielectric cap layer 16, exposing the photoresist to a desired pattern of radiation, and then developing the exposed photoresist with a conventional resist developer to provide a patterned photoresist atop the dielectric cap layer 16. A two-stage anisotropic etch may be conducted to transfer the pattern from the patterned photoresist into the dielectric cap layer 16 and the top semiconductor layer 14. In one embodiment, the etch used for pattern transfer may include a dry etch process such as, for example, reactive ion etch (RIE), plasma etching, ion beam etching or laser ablation. During the first stage of the anisotropic etch, the exposed portions of the dielectric cap layer 16 are removed selective to the top semiconductor layer 14, exposing portions of the top semiconductor layer 14. Remaining portions of the dielectric cap layer 16 after the lithographic patterning constitute dielectric caps 20A, 20B and function as an etch mask that protects the underlying portions of the top semiconductor layer 14 from which semiconductor fins 18A, 18B are subsequently formed. During the second stage of the anisotropic etch, the exposed portions of the top semiconductor layer 14 are removed selective to the buried insulator layer 12 utilizing the underlying buried insulator layer 12 as an etch stop. Remaining portions of the top semiconductor layer 14 after the lithographic patterning constitute semiconductor fins 18A, 18B. After transferring the pattern into the dielectric cap layer 16 and the top semiconductor layer 14, the patterned photoresist can be removed utilizing a conventional resist stripping process such as, for example, ashing. Other methods known in the art such as sidewall image transfer (SIT) or directional self-assembly (DSA) can be used to pattern the semiconductor fins 18A, 18B.

The semiconductor fins 18A, 18B are formed such that the first semiconductor fins 18A in the logic device region are separated from each other by a first spacing $d_1$ and the second semiconductor fins 18B in the memory device region are separated from each other by a second spacing $d_2$. The second spacing $d_2$ is set to be greater than the first spacing $d_1$. In one embodiment, the second spacing $d_2$ is two times greater than the first spacing $d_1$. The distance (i.e., third spacing $d_3$) that separates the two sets of semiconductor fins (i.e., first semiconductor fins 18A and second semiconductor fins 18B) is also set to be greater than the first spacing $d_1$. In some embodiments of the present application, the first spacing $d_1$ between adjacent first semiconductor fins in the logic device region 18A may range from 10 nm to 50 nm.

Figure 3:
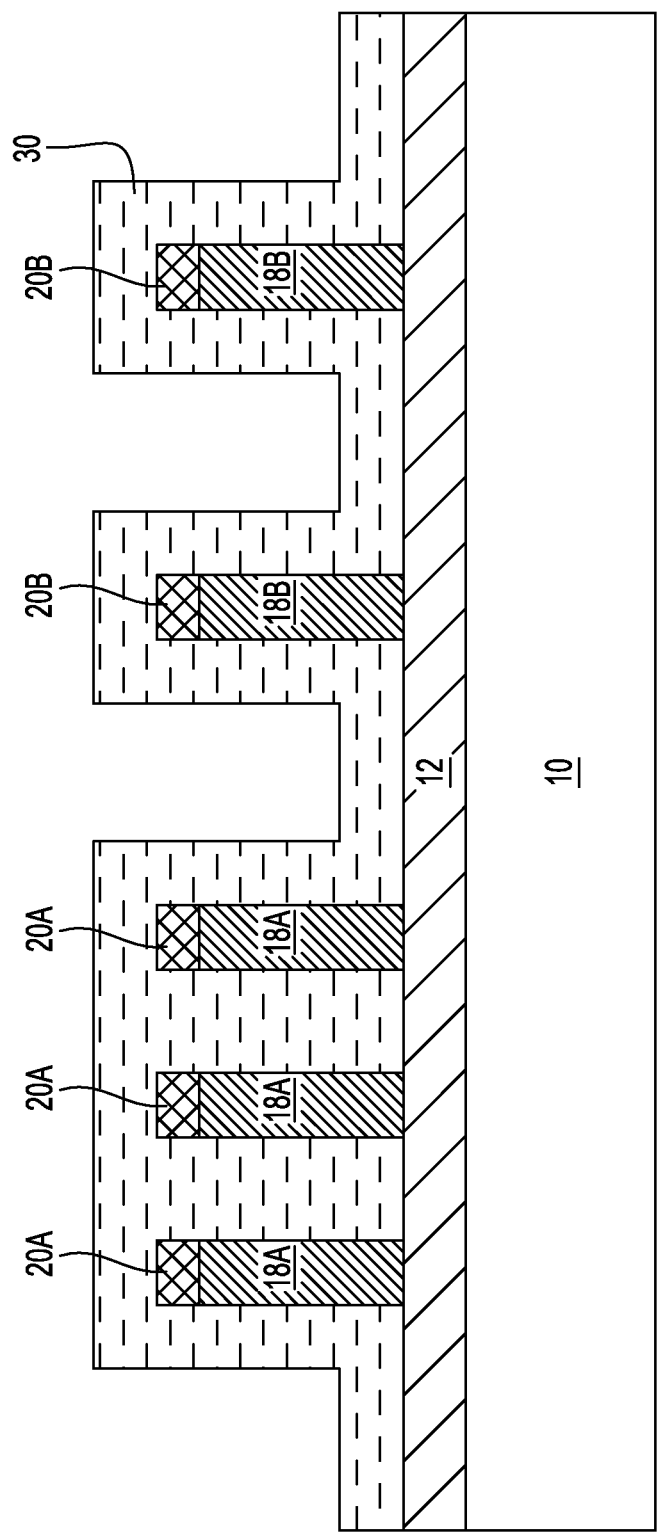
FIG. 3 is a cross-sectional view of the exemplary semiconductor structure after forming a conformal sacrificial spacer material layer over vertical stacks of first semiconductor fins and first dielectric caps, vertical stacks of second semiconductor fins and second dielectric caps and exposed surfaces of the semiconductor substrate.

Referring to FIG. 3, a sacrificial spacer material layer 30 is conformally deposited over vertical stacks of first semiconductor fins 18A and first dielectric caps 20A, vertical stacks of second semiconductor fins 18B and second dielectric caps 20B, and exposed surfaces of the buried insulator layer 12 by a conformal deposition process, such as, for example, CVD, atomic layer deposition (ALD) or spinning coating. The sacrificial spacer material layer 30 is formed such that the sacrificial spacer material layer 30 completely fills spaces between adjacent first semiconductor fins 18A in the logic device region, but only partially fills spaces between adjacent second semiconductor fins 18B in the memory device region as well as the space between the two sets of semiconductor fins 18A, 18B. Thus, the thickness of the sacrificial spacer material layer 30 is selected to be greater than one half of the first spacing $d_1$, but less than one half of the second spacing $d_2$ and the third spacing $d_3$, respectively. In one embodiment, the sacrificial spacer material layer 30 can have a thickness ranging from 5 nm to 50 nm, and preferably about 15 nm.

The sacrificial spacer material layer 30 can include a material having the capability of filling very tight spaces between the first semiconductor fins 18A in the logic device region. Exemplary materials that can be employed as the sacrificial spacer material layer 30 include, but are not limited to amorphous carbon, oxide or titanium nitride. In some embodiments of the present application, the sacrificial spacer material layer 30 may include SiGe when the semiconductor fins 18A, 18B are composed of Si.

Figure 4:
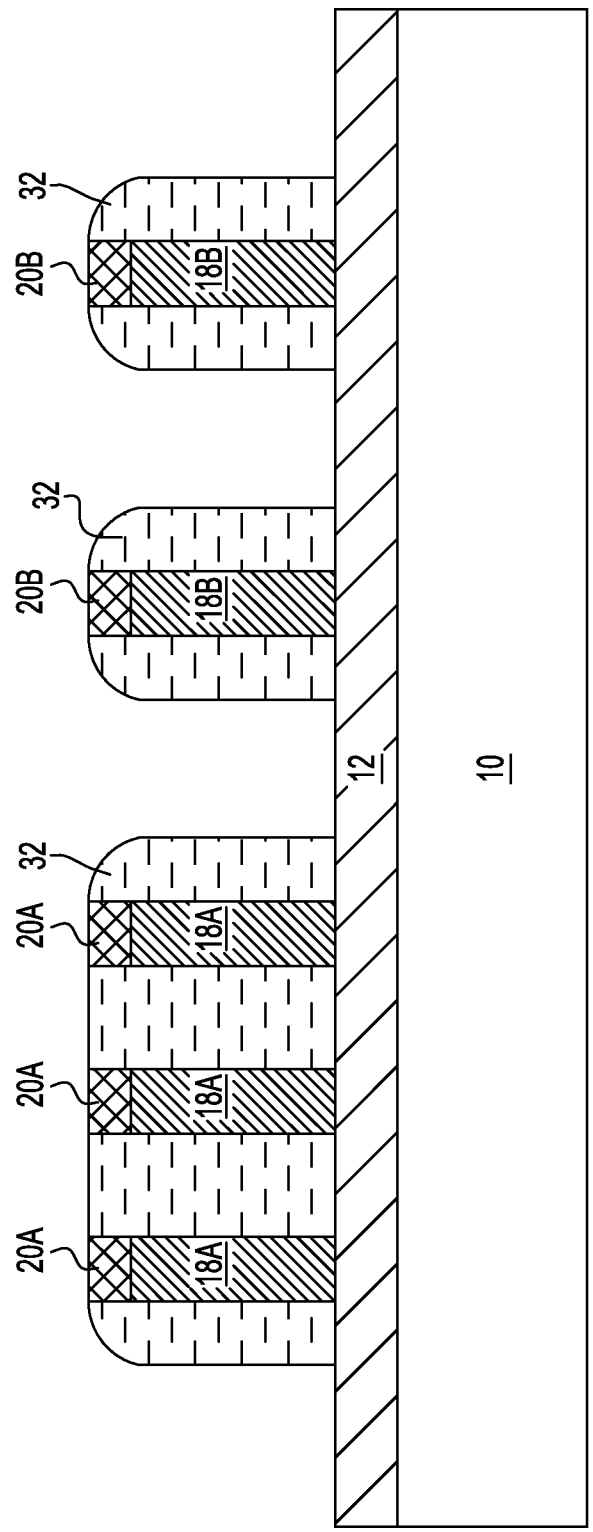
FIG. 4 is a cross-sectional view of the exemplary semiconductor structure after forming sacrificial spacers on sidewalls of the vertical stacks of first semiconductor fins and first dielectric caps, and the vertical stacks of second semiconductor fins and second dielectric caps.

Referring to FIG. 4, the sacrificial spacer material layer 30 can be anisotropically etched to remove horizontal portions of the sacrificial spacer material layer 30. The anisotropic etch may be a wet chemical etch or a dry etch such as, for example, RIE. Remaining vertical portions of the spacer material layer 30 that are present on sidewalls of the vertical stacks of first semiconductor fins 18A and first dielectric caps 20A and the vertical stacks of second semiconductor fins 18B and second dielectric caps 20B are herein referred to as sacrificial spacers 32. Gaps are present between sacrificial spacers 32 above the top surface of the buried insulator layer 12. The removal of the horizontal portions of the sacrificial spacer material layer 30 also exposes top surfaces of the first and the second dielectric caps 20A, 20B.

Figure 5:
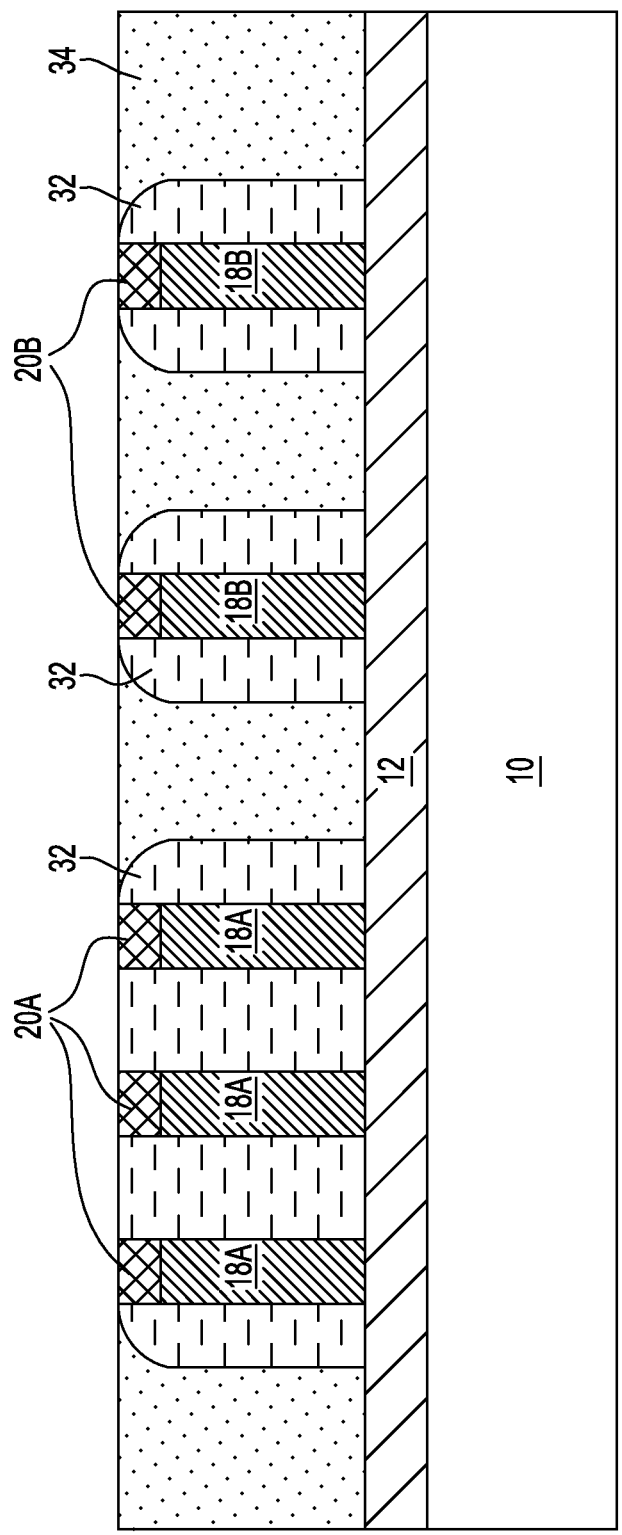
FIG. 5 is a cross-sectional view of the exemplary semiconductor structure after forming dielectric barrier layer portions on the substrate to fill gaps between sacrificial spacers.

Referring to FIG. 5, a dielectric barrier layer (not shown) is formed over the vertical stacks of first semiconductor fins 18A and first dielectric caps 20A, the vertical stacks of second semiconductor fins 18B and second dielectric caps 20B, the sacrificial spacers 32 and exposed surfaces of the buried insulator layer 12. The dielectric barrier layer fills the gaps between the sacrificial spacers 32. The thickness of the dielectric barrier layer can be selected so that an entirety of the top surface of the dielectric barrier layer is located above the top surfaces of the dielectric caps 20A, 20B. The dielectric barrier layer may include a dielectric material that has a higher etch resistance compared to the material of the sacrificial spacers 32 so that it remains in the structure after the removal of the sacrificial spacers 32. In one embodiment, the dielectric barrier layer can be composed of silicon nitride, silicon oxide, hafnium oxide or hafnium nitride. The dielectric material of the dielectric barrier layer can be deposited, for example by CVD or ALD.

Subsequently, the dielectric barrier layer can be planarized, for example, by a recess etch and/or chemical mechanical planarization (CMP) to provide dielectric barriers layer portions 34. In one embodiment, the sacrificial spacers 32 can be employed as an etch stop for the planarization process. The planarization of the dielectric barrier layer also planarizes the vertical stacks of first semiconductor fins 18A and first dielectric caps 20A and the vertical stacks of second semiconductor fins 18B and second dielectric caps 20B, thereby improving the fin height uniformity in the logic device region and the memory device region with different fin densities.

Figure 6:
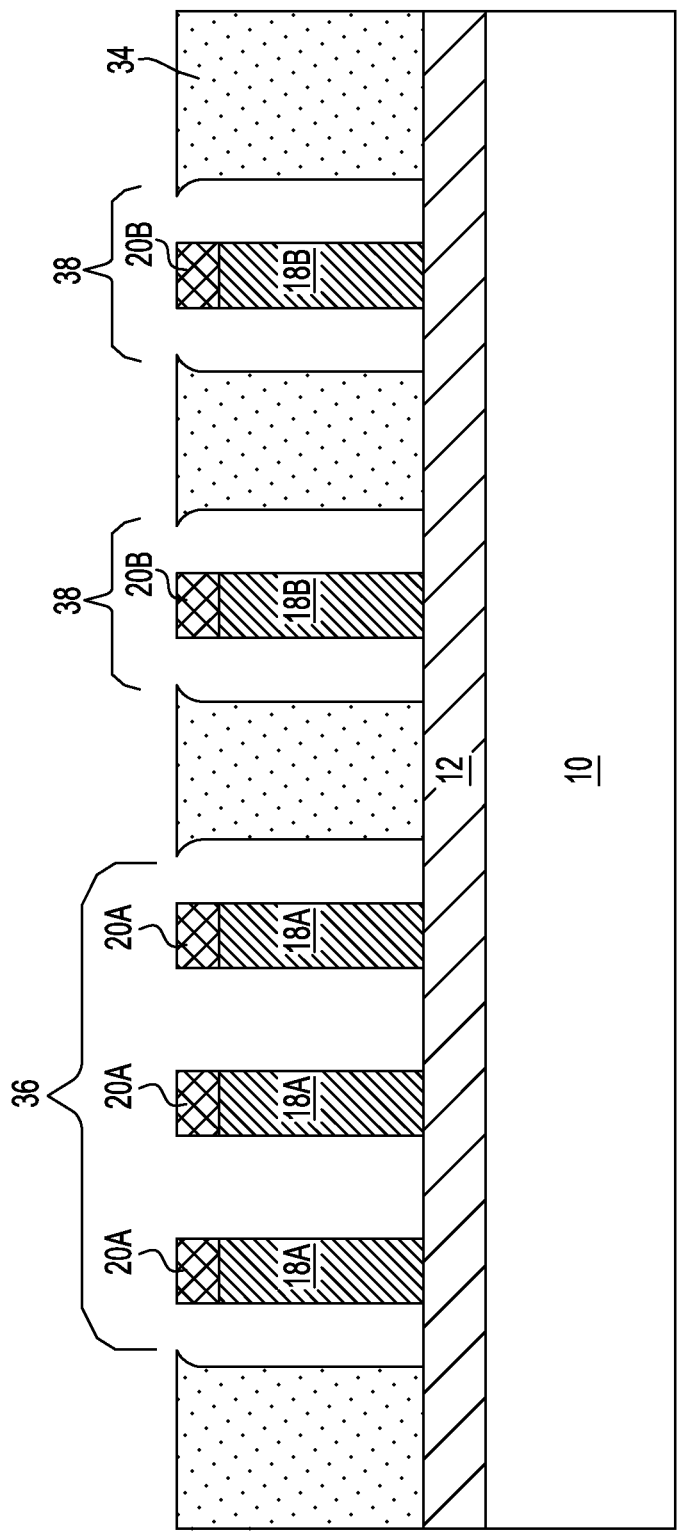
FIG. 6 is a cross-sectional view of the exemplary semiconductor structure after removing sacrificial spacers.

Referring to FIG. 6, the sacrificial spacers 32 are removed selective to the dielectric barrier layer portions 34 to provide a first trench 36 in the logic device regions and second trenches 38 in the memory device region. The first trench 36 includes the whole set of the vertical stacks of first semiconductor fins 18A and first dielectric caps 20A, while each of the second trenches 38 includes a single vertical stack of second semiconductor fin 18B and second dielectric cap 20B.

In the logic device region, the vertical sidewalls of the first trench 36 (i.e., sidewalls of the dielectric barriers layer portions 34) are laterally spaced from outermost sidewalls of the vertical stacks of first semiconductor fins 18A and first dielectric caps 20A by a lateral distance which is the same as the thickness of the sacrificial spacer 32. The outermost sidewalls of the vertical stacks of first semiconductor fins 18A and first dielectric caps 20A are the outside sidewalls of the vertical stacks of first semiconductor fins 18A and first dielectric caps 20A at each end of the vertical stack array.

In the memory device region, the vertical sidewalls of each of the second trenches 38 (i.e., sidewalls of the dielectric barriers layer portions 34) are laterally spaced from sidewalls of a corresponding vertical stacks of second semiconductor fins 18B and second dielectric caps 20B by a lateral distance which is also the same as the thickness of the sacrificial spacers 32.

After the removal of the sacrificial spacer 32, in the logic device region an entirety of the vertical stacks of first semiconductor fins 18A and first dielectric caps 20A is laterally enclosed by a pair of neighboring dielectric barriers layer portions 34, while in the memory device region, each of the vertical stacks of second semiconductor fins 18B and second dielectric caps 20B is laterally enclosed by a pair of neighboring dielectric barriers layer portions 34.

Figure 7:
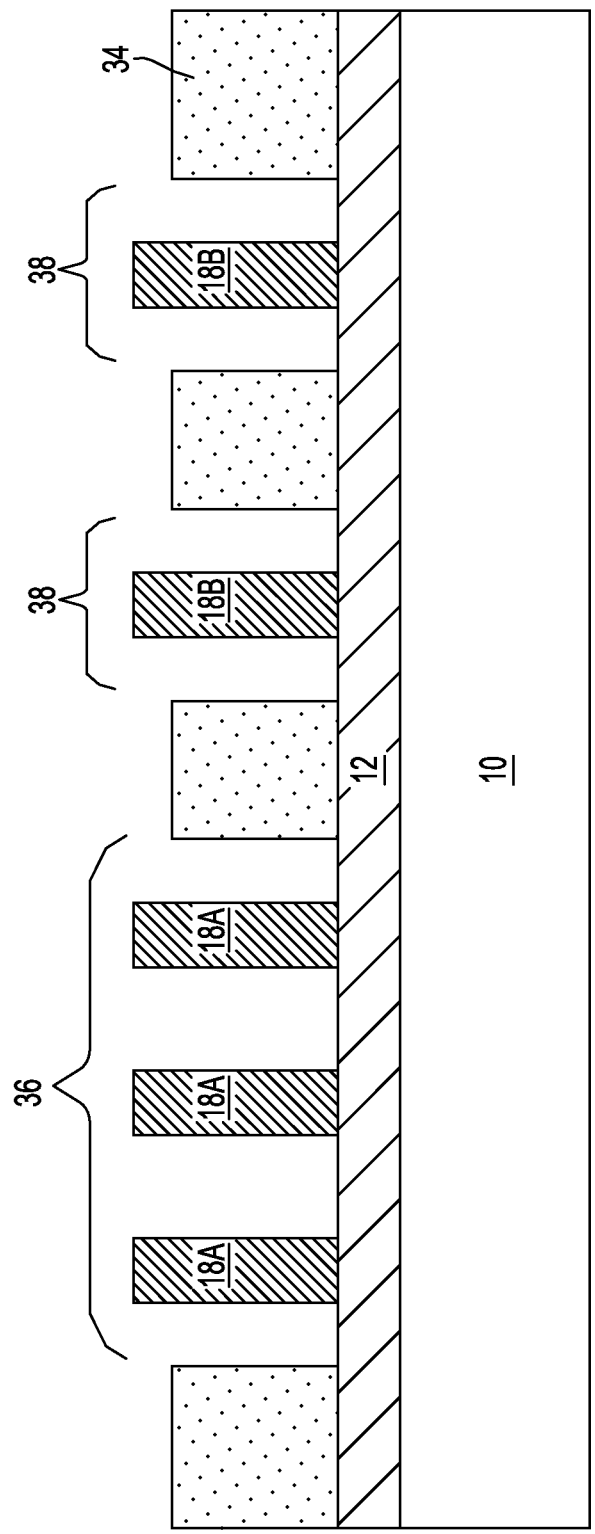
FIG. 7 is a cross-sectional view of the exemplary semiconductor structure of after removing the first and the second dielectric caps.

Referring to FIG. 7, the dielectric caps 20A, 20B can be removed from above the semiconductor fins 18A, 18B to expose top surfaces of the semiconductor fins 18A, 18B. The dielectric caps 20A, 20B may be removed by an anisotropic etching process, such as, for example, RIE. In one embodiment, an over-etch may be performed to ensure that the dielectric caps 20A, 20B are completely removed from the top surfaces of the semiconductor fins 18A, 18B. The over-etch may remove portions of the dielectric barrier layer portions 34. Top surfaces of the dielectric barrier layer portions 34 are thus located slightly below the top surfaces of the semiconductor fins 18A, 18B.

Figure 8A:
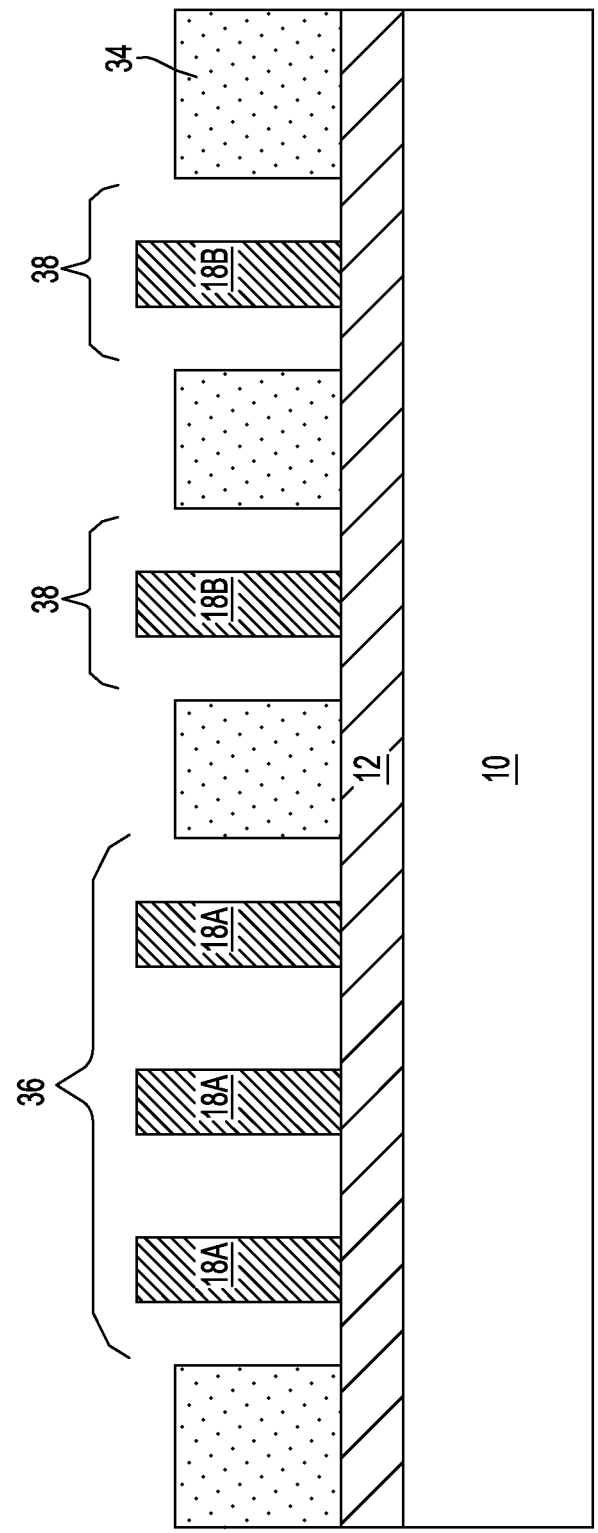
FIG. 8A is cross-sectional view of the exemplary semiconductor structure at the processing step of FIG. 8C along a vertical plane A-A' of FIG. 8C.
Figure 8B:
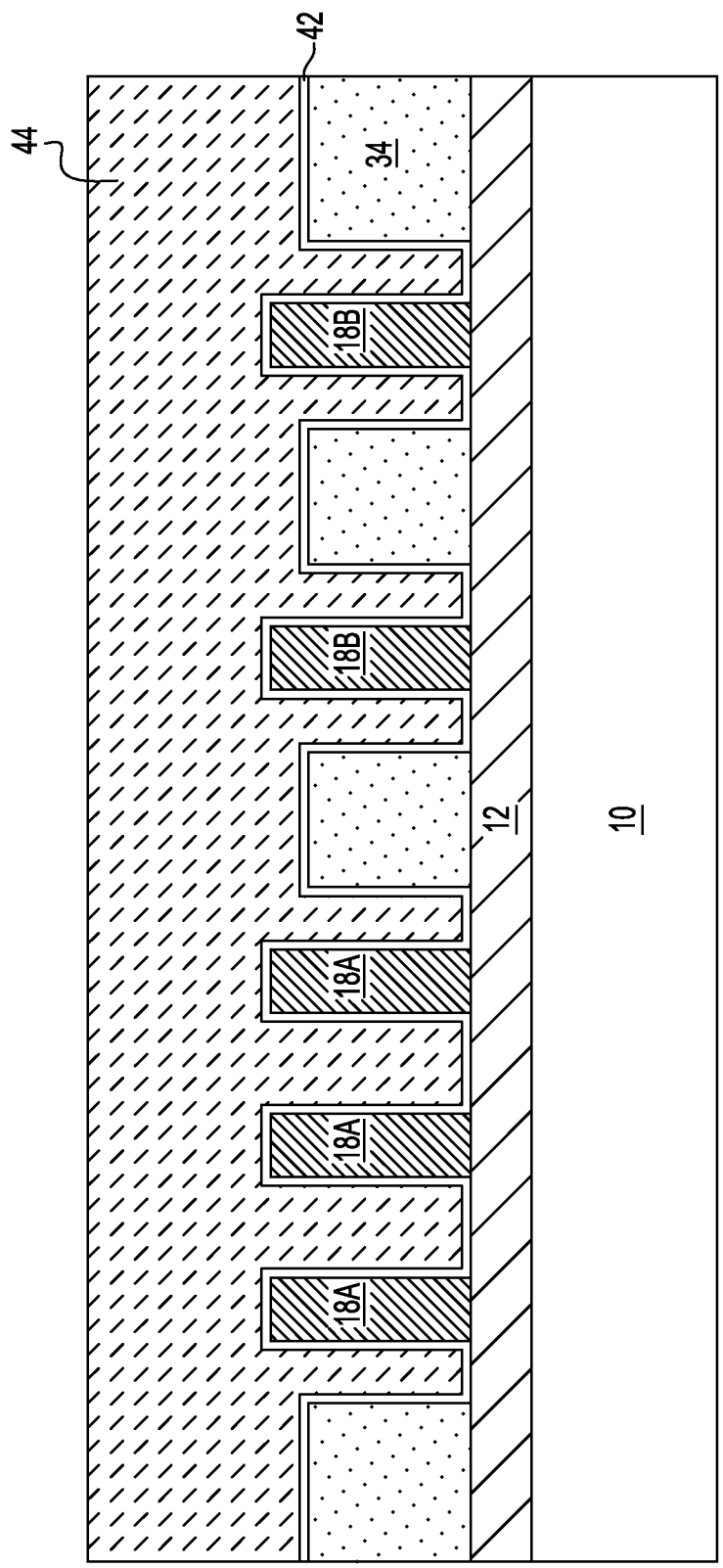
FIG. 8B is cross-sectional view of the exemplary semiconductor structure after forming a gate structure over a channel portion of each of the plurality of the first semiconductor fins and the plurality of second semiconductor fins along a vertical plane B-B' of FIG. 8C.
Figure 8C:
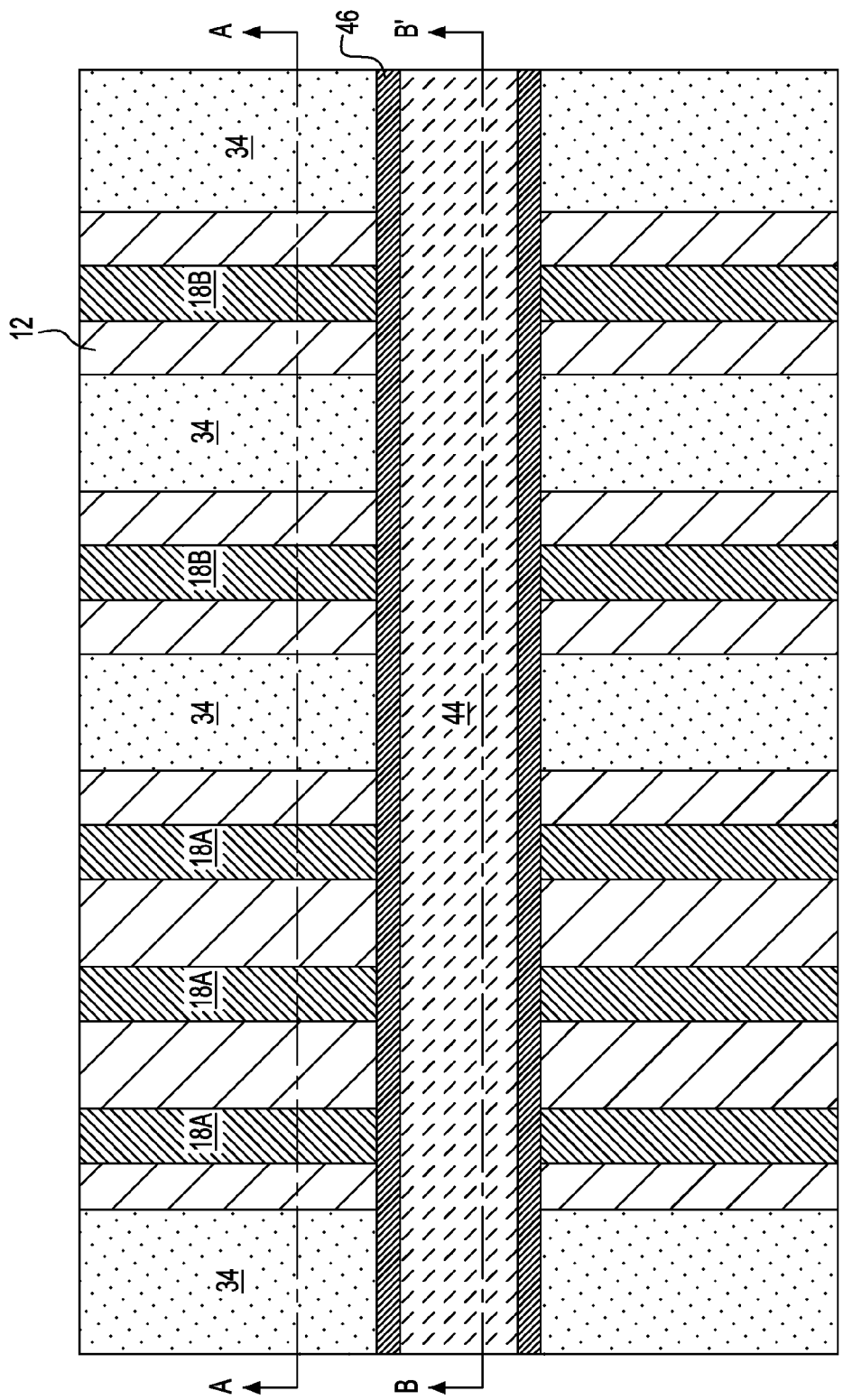
FIG. 8C is a top view of the exemplary semiconductor structure after forming a gate structure over a channel portion of each of the plurality of the first semiconductor fins and the plurality of second semiconductor fins.

Referring to FIGS. 8A-8C, a gate structure is formed overlying the semiconductor fins 18A, 18B. In one embodiment and as shown in FIGS. 8B and 8C, the gate structure is a functional gate structure. The term "functional gate structure" as used herein denotes a permanent gate structure used to control output current (i.e., flow of carriers in the channel) of a semiconducting device through electrical fields. The gate structure may include a gate dielectric 42 in contact with a channel portion of each of the semiconductor fins 18A, 18B and a gate electrode 44 present on the gate dielectric 42. The channel portion is a region that becomes conductive when the semiconductor device is turned on. The gate structure further includes a gate spacer 46 present on sidewalls of the gate dielectric 42 and the gate electrode 44.

The gate structure may be formed using deposition, photolithography and selective etch processes. A gate layer stack is first formed by depositing a gate dielectric layer (not shown) over the semiconductor fins 18A, 18B, the dielectric barrier layer portions 34 and exposed surfaces of the buried insulator layer 12 and then a gate electrode layer (not shown) on the gate dielectric layer.

The gate dielectric layer may include a high-k dielectric material with a dielectric constant greater than 8.0. Examples of high-k dielectric material include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high-k dielectric materials can also be employed as the gate dielectric layer. Each value of x is independently from 0.5 to 3 and each value of y is independently from 0 to 2.

The gate dielectric layer can be formed by utilizing a deposition process such as, for example, CVD, physical vapor deposition (PVD), molecular beam deposition (MBD), pulsed laser deposition (PLD), liquid source misted chemical deposition (LSMCD) and atomic layer deposition (ALD). The gate dielectric layer that is formed may have a thickness ranging from 0.9 nm to 6 nm, with a thickness ranging from 1.0 nm to 3 nm being more typical.

The gate electrode layer may comprise any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof.

The gate electrode layer can be formed utilizing a conventional deposition process including, for example, CVD, plasma enhanced chemical vapor deposition (PECVD), evaporation, PVD, sputtering, chemical solution deposition and ALD. The gate electrode layer that is formed typically has a thickness from 10 nm to 100 nm, with a thickness from 20 nm to 50 nm being even more typical.

The gate layer stack is then patterned and etched to provide the gate dielectric 42 and the gate electrode 44. Specifically, a pattern is produced by applying a photoresist to a topmost surface of the gate layer stack, exposing the photoresist to a pattern of radiation, and then developing the pattern into the photoresist utilizing a resist developer. Once the patterning of the photoresist is completed, the sections of the gate layer stack covered by the photoresist are protected while the exposed regions are removed using a selective etching process that removes the unprotected regions.

Subsequently, the gate spacer 46 is formed on opposite sidewalls of the gate dielectric 42 and gate electrode 46. The gate spacer 46 can be formed by first depositing a conformal gate spacer material layer (not shown) on exposed surfaces of the gate dielectric 42, the gate electrode 46, the semiconductor fins 18A, 18B, the dielectric barrier layer portions 34 and the buried insulator layer 12 utilizing a conventional deposition process including, for example, CVD or ALD, followed by an anisotropic etch that removes horizontal portions of the conformal gate spacer material layer. The remaining vertical portions of the conformal gate spacer material layer constitute the gate spacer 46.

The gate spacer 46 may include any dielectric material such as, for example, an oxide, a nitride, an oxynitride, silicon boron carbon nitride (SiBCN), silicon carbon oxynitride (SiOCN), or any combination thereof. In one embodiment, the gate spacer 46 is composed of silicon nitride.

In another embodiment, the gate structure is a sacrificial gate structure (not shown) for a replacement gate process. The term "sacrificial gate structure" as used herein denotes a structure that serves as a placeholder structure for a functional gate structure to be subsequently formed. The sacrificial gate structure can be formed by first providing a blanket layer of a sacrificial gate material. The blanket layer of sacrificial gate material can be formed, for example, by CVD or PECVD. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure. The sacrificial gate structure can be replaced with a function gate structure after forming a source region and a drain region (collectively referred to hereinafter as "source/drain regions") described below.

Figure 9:
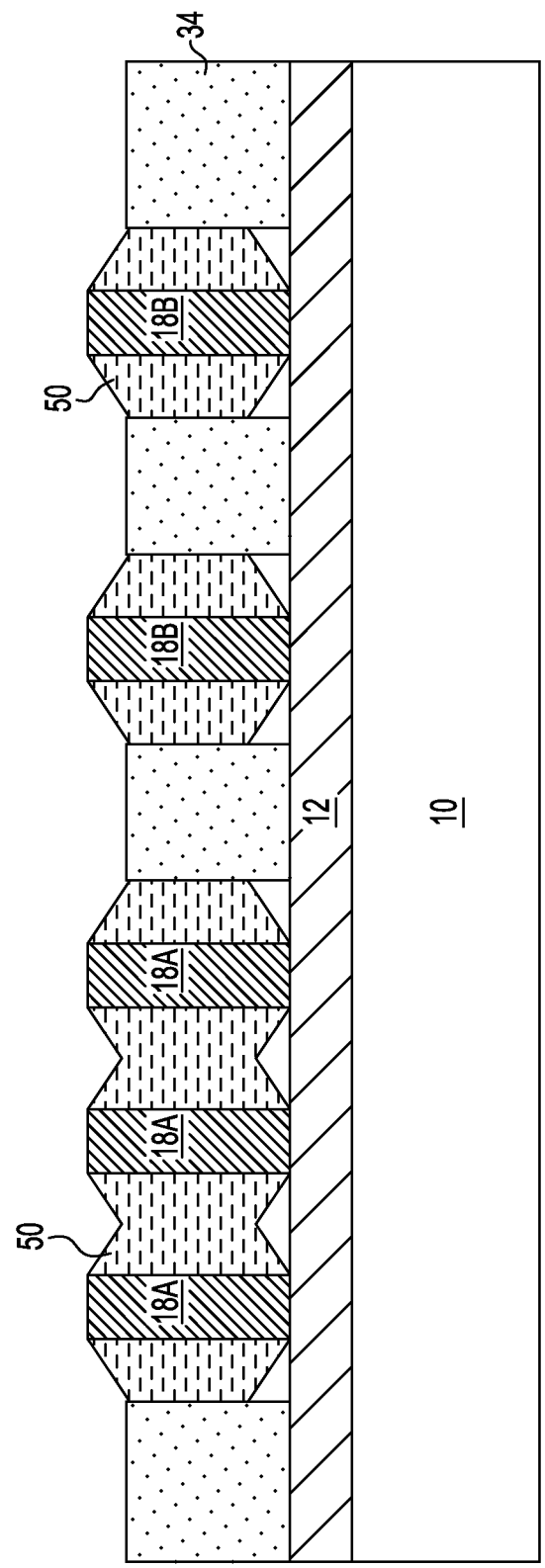
FIG. 9 is a cross-sectional view of the exemplary semiconductor structure of FIG. 8A after forming source/drain regions.

Referring to FIG. 9, source/drain regions 50 are formed on exposed surfaces of the semiconductor fins 18A, 18B that are not covered by the gate structure (42, 44, 46) in the first trench 36 and the second trenches 38, for example, by a selective epitaxy. During the selective epitaxy process, the deposited semiconductor material grows only on exposed semiconductor surfaces, such as the sidewalls of the semiconductor fins 18A, 18B that were exposed by the removal of the sacrificial spacers 32, but does not grow on dielectric surfaces, such as surfaces of the dielectric barrier portions 34, the gate spacer 46 and the buried insulator layer 12. The selective epitaxy process may be continued until the epitaxially deposited semiconductor material fills the spaces between adjacent first semiconductor fins 18A in the first trench 36 so as to merge individual first semiconductor fins 18A together, thereby reducing the source/drain resistance in the logic device region. The presence of the dielectric barrier layer portions 34 obstructs the lateral growth of epitaxial semiconductor material from extending beyond the dielectric barrier layer portions 34, thus preventing the merging of the individual second semiconductor fins 18B in the memory device region. The source/drain regions 50 for each second semiconductor fin 18B remain separate from each other, thus the deposition of an excess semiconductor material during the selective epitaxy to ensure sufficient source/drain epitaxy in the logic region will not cause electrical shorts in the memory device region. Further, the dielectric barrier layer portion 34 located at the boundary of the logic device region and the memory device region also prevents the intra-fin merging between two sets of the semiconductor fins 18A, 18B, thus electrically isolating the logic device region and the memory device region.

In some embodiments of the present application, the source/drain regions 50 may be provided by epitaxially deposited a silicon-containing semiconductor material such as, for example, Si, SiGe and Si:C. The epitaxial growth of the silicon-containing semiconductor material can be effected by placing the semiconductor structure into a reaction chamber, and simultaneously, or alternately, flowing at least one silicon source reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

In other embodiments of the present application, the source/drain regions 50 may be provided by epitaxially deposited a germanium-containing semiconductor material. The epitaxial growth of the germanium-containing semiconductor material can be effected by placing the semiconductor structure into a reaction chamber and flowing a germanium-containing reactant gas into the reaction chamber. Exemplary germanium-containing reactant gases include $GeH_4$, $GeH_2Cl_2$, $GeCl_4$, and $Ge_2H_6$. The germanium-containing semiconductor material can be deposited by CVD, vacuum evaporation, or ALD at a temperature ranges from 450° C. to 900° C.

The semiconductor material (i.e., silicon-containing semiconductor material and germanium-containing semiconductor material) of the source/drain regions 50 can be deposited as an intrinsic semiconductor material, or can be deposited with in-situ doping. If the semiconductor material is deposited as an intrinsic semiconductor material, the source/drain regions 50 may be subsequently doped (ex-situ) utilizing ion implantation, gas phase doping or dopant out diffusion from a sacrificial dopant source material.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:

forming a plurality of first semiconductor fins in a first device region of a substrate and a plurality of second semiconductor fins in a second device region of the substrate, wherein the plurality of first semiconductor fins are separated from each other by a first spacing and the plurality of second semiconductor fins are separated from each other by a second spacing that is greater than the first spacing;

forming sacrificial spacers on sidewalls of the plurality of first semiconductor fins and the plurality of second semiconductor fins, wherein the sacrificial spacers fill spaces between the plurality of first semiconductor fins, but only partially fill spaces between the plurality of second semiconductor fins and between an outermost first semiconductor fin of the plurality of first semiconductor fins and an adjacent outermost second semiconductor fin of the plurality of second semiconductor fins, leaving gaps between the plurality of second semiconductor fins and between the outermost first semiconductor fin and the adjacent outermost second semiconductor fin;

forming dielectric barrier layer portions on the substrate, the dielectric barrier layer filling the gaps between the sacrificial spacers;

removing the sacrificial spacers selective to the dielectric barrier layer portions;

forming a gate structure over a channel portion of each of the plurality of first semiconductor fins and the plurality of second semiconductor fins; and forming source/drain regions on portions of the plurality of first semiconductor fins and the plurality of second semiconductor fins that are not covered by the gate structure, wherein the source/drain regions merge the plurality of first semiconductor fins but not the plurality of second semiconductor fins.

2. The method of claim 1, wherein the first device region is a logic device region and the second device region is a memory device region.

3. The method of claim 2, wherein the substrate comprises an insulator layer present on a handle substrate.

4. The method of claim 3, wherein the forming the plurality of first semiconductor fins and the plurality of second semiconductor fins comprises:

forming a dielectric cap layer over a top semiconductor material layer present on the substrate;

patterning the dielectric cap layer; and patterning the top semiconductor layer using the patterned dielectric cap layer as an etch mask to provide the plurality of first semiconductor fins and the plurality of second semiconductor fins, wherein each of the plurality of first semiconductor fins has a first dielectric cap formed thereupon, and each of the plurality of second semiconductor fins has a second dielectric cap formed thereupon.

5. The method of claim 4, wherein the forming the sacrificial spacers on sidewalls of the plurality of first semiconductor fins and the plurality of second semiconductor fins comprises:

forming a conformal sacrificial spacer material layer over the plurality of the first semiconductor fins, the plurality of the second semiconductor fins and exposed surfaces of the substrate; and removing horizontal portions of the conformal sacrificial spacer material layer by an anisotropic etch, wherein remaining portions of the conformal sacrificial spacer material layer constitute the sacrificial spacers.

6. The method of claim 5, wherein the forming the dielectric barrier layer portions comprises:

forming a dielectric barrier layer over the plurality of the first semiconductor fins, the plurality of the second semiconductor fins, the sacrificial spacers and exposed surfaces of the substrate, the dielectric barrier layer filling gaps between the sacrificial spacers; and planarizing the dielectric barrier layer employing sacrificial spacers as a etch stop.

7. The method of claim 6, further comprising removing the first dielectric caps from the plurality of first semiconductor fins and the second dielectric caps from the plurality of second semiconductor fins after the removing the sacrificial spacers selective to the dielectric barrier layer portions.

8. The method of claim 7, wherein the removing the first and the second dielectric caps also removes upper portions of the dielectric barrier layer portions such that top surfaces of the dielectric barrier layer portions are located slightly lower than top surfaces of the plurality of first semiconductor fins and the plurality of second semiconductor fins.

9. The method of claim 1, wherein after the removing the sacrificial spacers selective to the dielectric barrier layer portions, an entirety of the plurality of first semiconductor fins are laterally enclosed by a corresponding pair of neighboring dielectric barrier layer portions, and wherein each of the plurality of the second semiconductor fins is laterally enclosed by a corresponding pair of neighboring dielectric barrier layer portions.

10. The method of claim 1, wherein the gate structure comprises a gate dielectric in contact with the channel portion of each of the plurality of first semiconductor fins and the plurality of second semiconductor fins, a gate electrode present on the gate dielectric, and a gate spacer on each sidewall of the gate dielectric and the gate electrode.

11. The method of claim 10, wherein the forming the gate structure comprises:

forming a gate dielectric layer on the plurality of first semiconductor fins, the plurality of second semiconductor fins, the dielectric barrier layer portions and exposed surfaces of the substrate;

forming a gate electrode layer on the gate dielectric layer; and patterning the gate dielectric layer and the gate electrode layer to provide the gate dielectric and the gate electrode.

12. The method of claim 11, wherein the forming the gate structure further comprises:

forming a gate spacer material layer on the gate dielectric, the gate electrode, the dielectric barrier layer portions and exposed surfaces of the substrate; and removing horizontal portions of the gate spacer material layer.

13. The method of claim 1, wherein the forming the source/drain regions on portions of the plurality of first semiconductor fins and the plurality of second semiconductor fins that are not covered by the gate structure comprises epitaxially depositing a semiconductor material on exposed surfaces of the plurality of first semiconductor fins and the plurality of second semiconductor fins.

14. The method of claim 13, wherein the dielectric barrier layer portions confine a lateral growth of the epitaxially deposited semiconductor material within each pair of neighboring dielectric layer portions such that in the first device region the epitaxially deposited semiconductor material extends between adjacent first semiconductor fins to merge the plurality of first semiconductor fins together, while in the second device region the epitaxially deposited semiconductor material grown on each of the plurality of second semiconductor fins remains separated from the epitaxially deposited semiconductor material grown on adjacent second semiconductor fins.

15. The method of claim 1, wherein the first spacing ranges from 10 nm to 50 nm.

* * * * *